(12) United States Patent
Uno (10) Patent No.: US 7,830,174 B2
(45) Date of Patent: Nov. 9, 2010

(54) INPUT/OUTPUT CIRCUIT

(75) Inventor: Osamu Uno, Kasugai (JP)

(73) Assignee: Fujitsu Semiconductor Limited, Yokohama (JP)

( * ) Notice: Subject to any disclaimer, the term of this patent is extended or adjusted under 35 U.S.C. 154(b) by 0 days.

(21) Appl. No.: 11/882,660

(22) Filed: Aug. 3, 2007

(65) Prior Publication Data
US 2008/0030232 A1    Feb. 7, 2008

(30) Foreign Application Priority Data
Aug. 7, 2006    (JP)    ............... 2006-214546

(51) Int. Cl.
*H03K 19/00* (2006.01)
*H03K 19/02* (2006.01)
(52) U.S. Cl. ............... 326/58; 326/81; 326/27
(58) Field of Classification Search ............ 326/56–59, 326/80–83, 86–87; 327/112, 534, 537
See application file for complete search history.

(56) References Cited

U.S. PATENT DOCUMENTS

| 5,117,129 | A | | 5/1992 | Hoffman et al. |
| 5,543,733 | A | * | 8/1996 | Mattos et al. ............ 326/81 |
| 5,844,425 | A | | 12/1998 | Nguyen et al. |
| 6,313,672 | B1 | * | 11/2001 | Ajit et al. ............ 327/112 |
| 6,803,789 | B1 | * | 10/2004 | Yu et al. ............ 326/81 |
| 6,838,915 | B2 | | 1/2005 | Shin |
| 2001/0015656 | A1 | * | 8/2001 | Tsuji ............ 326/57 |

FOREIGN PATENT DOCUMENTS

| EP | 0668658 A2 | 8/1995 |
| EP | 0668658 A3 | 8/1995 |
| JP | 08-251004 B2 | 9/1996 |
| JP | 08-330940 B2 | 12/1996 |
| JP | 09-064718 B2 | 3/1997 |
| JP | 3190233 B2 | 5/2001 |

OTHER PUBLICATIONS

European Search Report mailed Sep. 3, 2008, in corresponding European patent application No. EP 07 11 3863.

* cited by examiner

*Primary Examiner*—Rexford N Barnie
*Assistant Examiner*—Jany Tran
(74) *Attorney, Agent, or Firm*—Arent Fox, LLP (57) ABSTRACT

An input/output circuit operable in input and output modes and including an input/output terminal, pull-up and pull-down output transistors, and first and second logic circuits operated in accordance with data and an enable signal. A control circuit maintains the pull-up output transistor in an inactivated state regardless of the voltage applied to the input/output terminal in the input mode. A switch circuit disconnects the first logic circuit from a power supply when an input signal having voltage higher than the power supply voltage of the power supply is input to the input/output terminal in the input mode. A back gate control circuit supplies back gates of P-channel MOS transistors in the first logic circuit and the switch circuit with back gate voltage having the same voltage as the input signal when the input signal is input in the input mode.

7 Claims, 5 Drawing Sheets

INPUT/OUTPUT CIRCUIT

CROSS-REFERENCE TO RELATED APPLICATIONS

This application is based upon and claims the benefit of priority from prior Japanese Patent Application No. 2006-214546, filed on Aug. 7, 2006, the entire contents of which are incorporated herein by reference.

BACKGROUND OF THE INVENTION

The present invention relates to an input/output circuit including an input/output terminal for receiving an input signal of which voltage is higher than a power supply voltage.

Nowadays, to increase integration and lower power consumption of a semiconductor device, a plurality of LSIs having different power supply voltages are connected to one another, and circuits having different power supply voltages are laid out on the same chip. Thus, a tolerant input/output circuit is used in such a semiconductor device. A tolerant input/output circuit operates with no difficulty even when inputting an input signal having a voltage higher than a power supply voltage. In such a tolerant input/output circuit, it is required that power consumption be reduced and operation frequency be improved.

Figure 1:
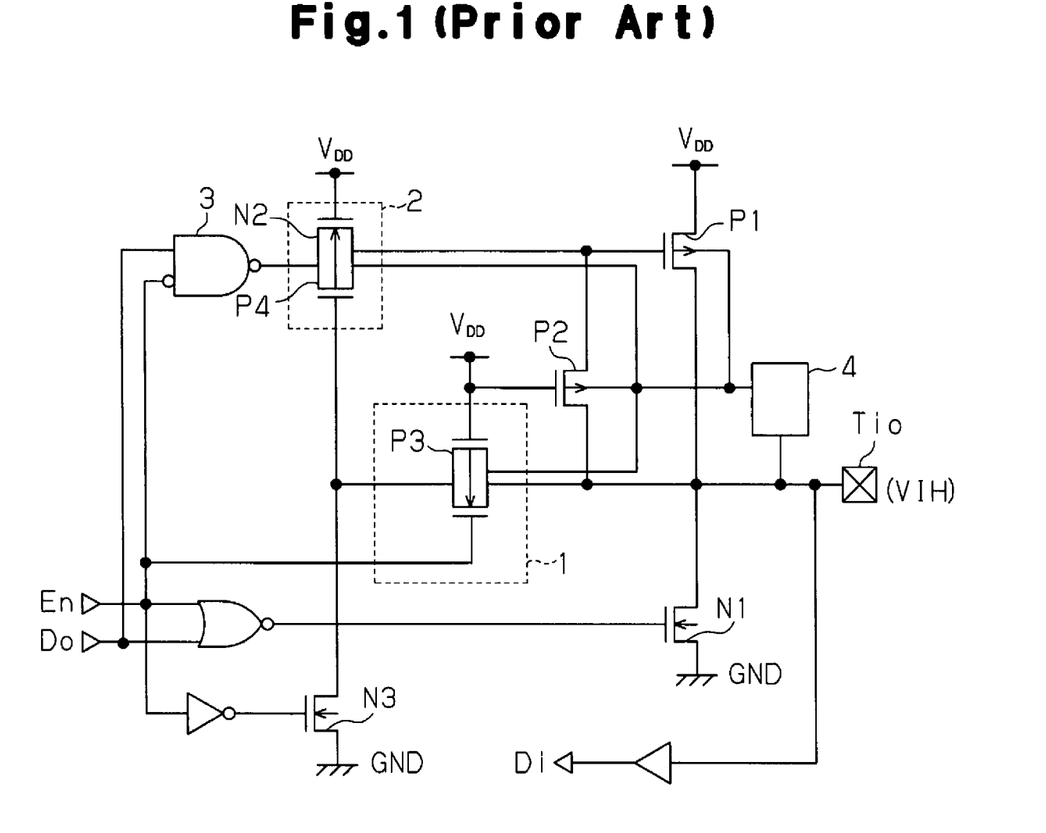
FIG. 1 is a circuit diagram of a conventional input/output circuit.

FIG. 1 shows a tolerant input/output circuit of a first conventional example. The tolerant input/output circuit enters an output mode when an enable signal En has an L level. In the output mode, either one of output transistors P1 and N1 is activated in response to data Do. This provides an output signal, which is in phase with the data Do, from an input/output terminal Tio to an external circuit (not shown). The tolerant input/output circuit enters an input mode when the enable signal En has an H level. In the input mode, the output transistors P1 and N1 are both inactivated, and an input signal Di provided from the external circuit to an input/output terminal Tio is further provided to an internal circuit.

To reduce power consumption, when the tolerant input/output circuit is in a standby state, the supply of power supply voltage $V_{DD}$ is suspended regardless of the state of the external circuit connected to the input/output terminal Tio.

The P-channel MOS transistor P2 is activated in a situation in which the tolerant input/output circuit is in the standby state, the supply of power supply voltage $V_{DD}$ is suspended, and input signal VIH having a voltage higher than the power supply voltage $V_{DD}$ is input to the input/output terminal Tio as the input signal Di. In response to activation of the P-channel MOS transistor P2, the input signal VIH is applied to the gate of the output transistor P1, which is formed by a P-channel MOS transistor. Accordingly, the output transistor P1 is not activated, and a current path from the input/output terminal Tio to the source of the power supply voltage $V_{DD}$ is not formed. That is, the input/output terminal Tio does not receive the power supply voltage $V_{DD}$.

In the above-mentioned situation, a P-channel MOS transistor P3, which is included in a transfer gate 1, is activated. Activation of the transistor P3 applies the input signal VIH to the gate of a P-channel MOS transistor P4, which is included in a transfer gate 2. As a result, the P-channel MOS transistor P4 and an N-channel MOS transistor N2, which are included in a transfer gate 2, are both inactivated. Therefore, a current path connecting the input/output terminal Tio, the transistor P2, the transfer gate 2, and an NAND circuit 3 is not formed.

A back gate control circuit 4 supplies an N-well (back gate) of the transistors P1 to P4 with voltage having a level that is greater than or equal to the power supply voltage $V_{DD}$ even if the supply of power supply voltage $V_{DD}$ is suspended. This prevents the generation of a PN junction diode between the power supply voltage $V_{DD}$ and the N-well of the transistors P1 to P4.

Therefore, in a state in which the supply of the power supply voltage $V_{DD}$ is suspended, the formation of unnecessary current paths is prevented even if a high voltage input signal VIH is input to the input/output terminal Tio. In this manner, power consumption is reduced in the tolerant input/output circuit of FIG. 1.

The tolerant input/output circuit enters the input mode when the power supply voltage $V_{DD}$ is supplied and the enable signal En has an H level. In the input mode, when the input/output terminal Tio is provided with the input signal VIH having a voltage higher than the power supply voltage $V_{DD}$ by an amount that is greater than or equal to the threshold value of a P-channel MOS transistor, the transistor P2 is activated and the input signal VIH is applied to the gate of the output transistor P1. This inactivates the output transistor P1. Thus, a current path connecting the input/output terminal Tio, the output transistor P1, and the source of the power supply voltage $V_{DD}$ is not formed.

In this situation, the transistor P3 of the transfer gate 1 is activated, the input signal VIH is applied to the gate of the transistor P4 of the transfer gate 2, and the transistor P4 is inactivated. As a result, only the N-channel MOS transistor N2 is activated in the transfer gate 2, and voltage that is lower than the power supply voltage $V_{DD}$ by an amount corresponding to the threshold value of the transistor N2 is applied to the output terminal of the NAND circuit 3.

At this point of time, the enable signal En has an H level, and the output signal of the NAND circuit 3 has an H level, or the power supply voltage $V_{DD}$ level. Therefore, a current path connecting the input/output terminal Tio, the transistors P2 and N2, and the NAND circuit 3 is not formed.

Furthermore, in the input mode, the N-channel MOS transistor N3 is inactivated in response to the enable signal En having an H level. Thus, a current path connecting the input/output terminal Tio, the transfer gate 1, the transistor N3, and the ground GND is not formed. Japanese Patent No. 3557694 describes a structure similar to the input/output circuit of FIG. 1.

Figure 2:
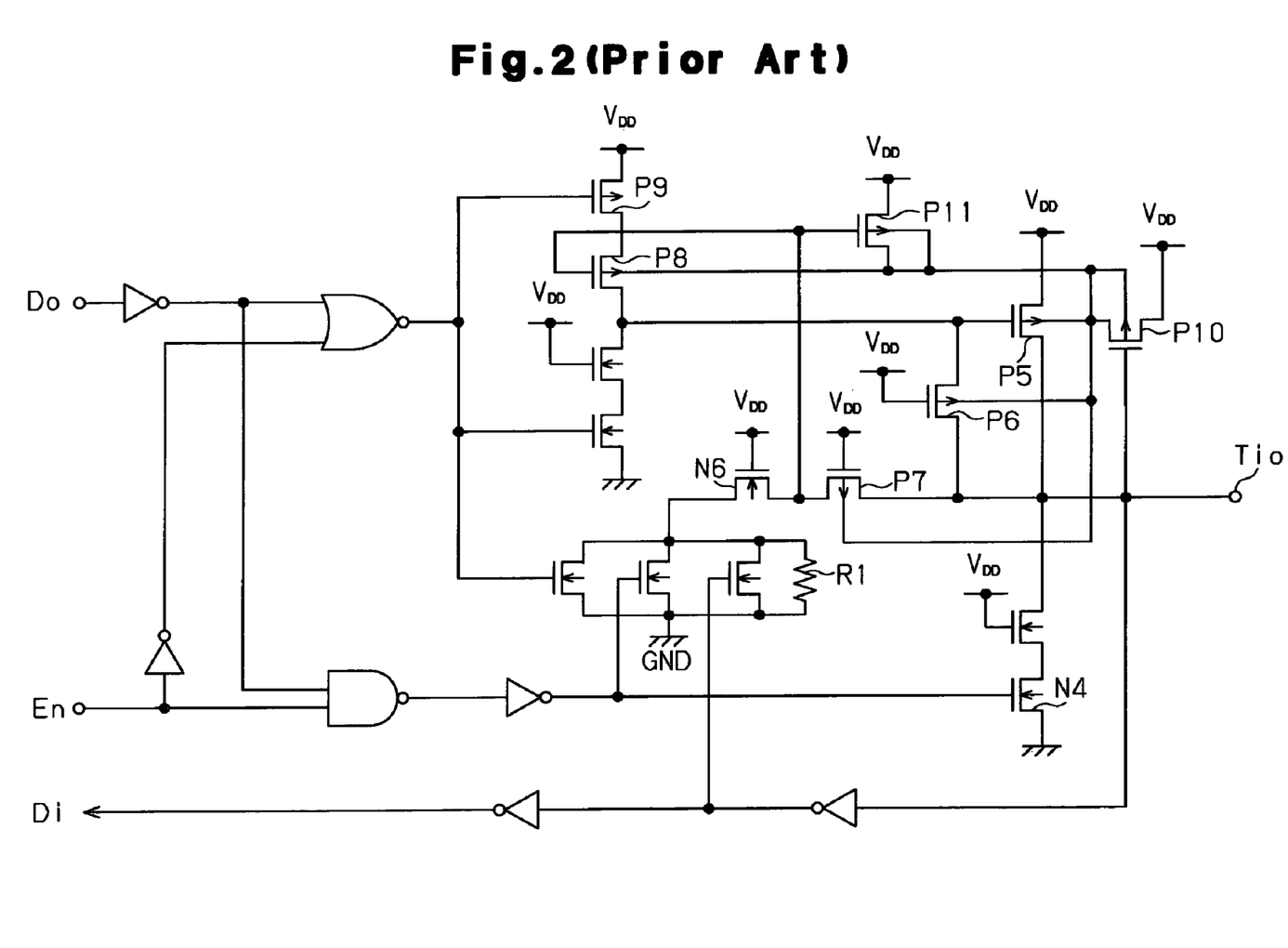
FIG. 2 is a circuit diagram of a conventional input/output circuit.

FIG. 2 shows a tolerant input/output circuit of a second conventional example described in Japanese Patent No. 3190233. In this tolerant input/output circuit, when the enable signal En has an H level, either one of the output transistors P5 and N4 is activated in accordance with the data Do, and an output signal that is in phase with the data Do is output from the input/output terminal Tio. When the enable signal En has an L level, the output transistors P5 and N4 are both inactivated, and the input signal Di provided from an external circuit to the input/output terminal Tio is further provided to an internal circuit.

To reduce power consumption, when the tolerant input/output circuit is in a standby state, the supply of power supply voltage $V_{DD}$ is suspended regardless of the state of the external circuit connected to the input/output terminal Tio.

When the tolerant input/output circuit is in the standby state and the supply of power supply voltage $V_{DD}$ is suspended, if a high voltage input signal VIH is input to the input/output terminal Tio as the input signal Di, the P-channel MOS transistor P6 is activated, and the input signal VIH is applied to the gate of the output transistor P5. However, the output transistor P5 is not activated in this state. Thus, a current path from the input/output terminal Tio to the source of the power supply voltage $V_{DD}$ is not formed.

Furthermore, the P-channel MOS transistor P7 is activated, and the input signal VIH is applied to the gate of the P-channel MOS transistor P8. Thus, the transistor P8 is inactivated. Accordingly, a current path connecting the input/output terminal Tio, the transistors P6, P8, and P9, and the source of the power supply voltage $V_{DD}$ is not formed.

In addition, the P-channel MOS transistors P10 and P11 are inactivated. Thus, the N-well of each of the transistors P5, P6, and P8 is in an indefinite state. This prevents the formation of a PN junction diode between the power supply voltage $V_{DD}$ and the N-well of the transistors P5, P6, and P8.

Similar operations are performed when the tolerant input/output circuit is in the input mode, supplied with the power supply voltage $V_{DD}$, and receives the enable signal En at an L level even if a high voltage input signal VIH is input to the input/output terminal Tio.

Figure 3:
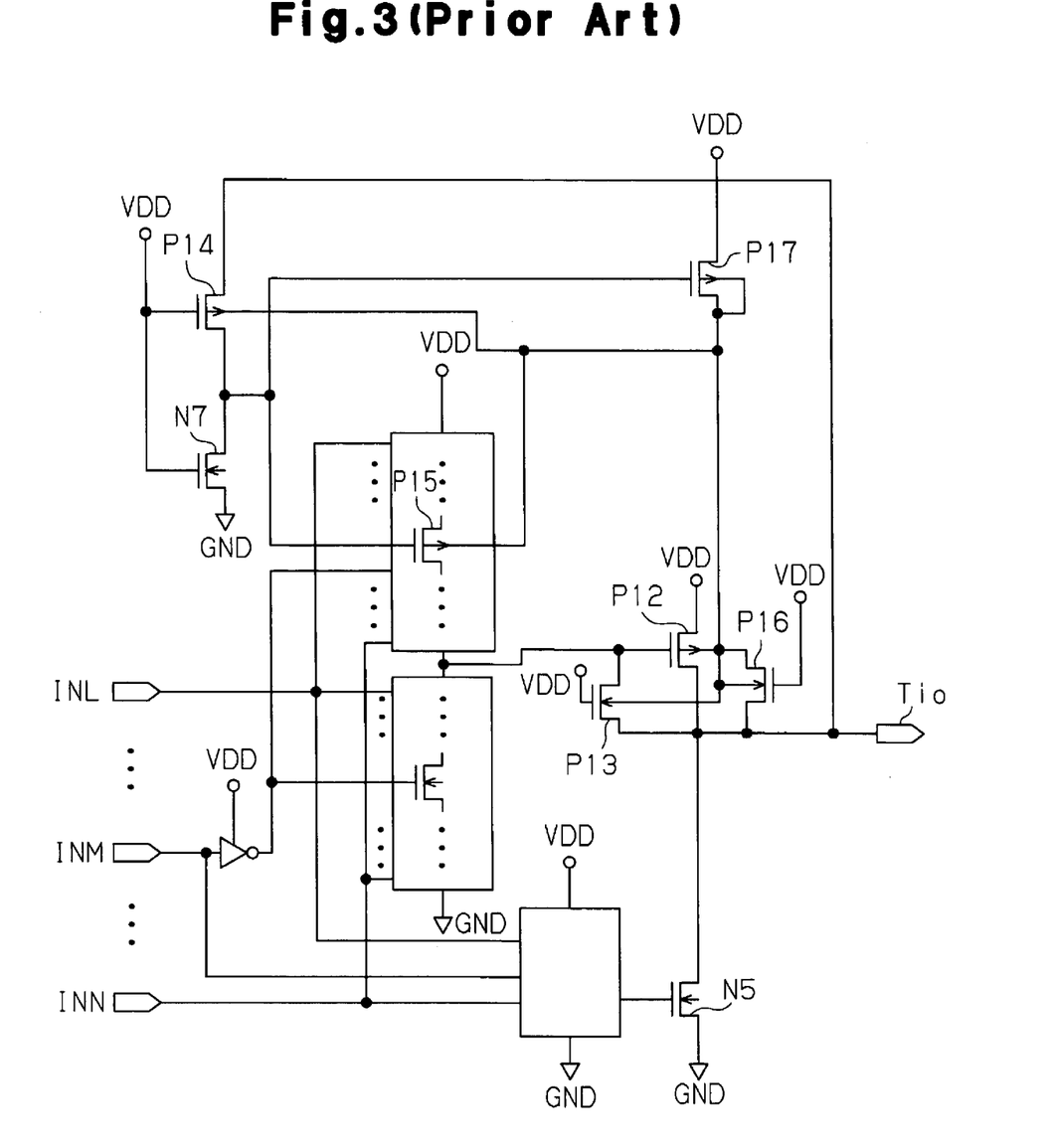
FIG. 3 is a circuit diagram of a conventional input/output circuit.

FIG. 3 shows a tolerant input/output circuit of a third conventional example described in Japanese Patent No. 3441238. The tolerant input/output circuit drives output transistors P12 and N5 in accordance with a plurality of input signals IN1 to INN.

The P-channel MOS transistor P13 is activated in a situation in which the tolerant input/output circuit is in the standby state, the supply of power supply voltage $V_{DD}$ is suspended, and a high voltage input signal VIH is input to the input/output terminal Tio. In response to activation of the P-channel MOS transistor P13, the input signal VIH is applied to the gate of the output transistor P12. However, the output transistor P12 is not activated in this state. Thus, a current path connecting the input/output terminal Tio, the output transistor P12, and the source of the power supply voltage $V_{DD}$ is not formed.

Furthermore, the P-channel MOS transistor P14 is activated, and the input signal VIH is applied to the gate of the P-channel MOS transistor P15. Thus, the transistor P15 is inactivated. Accordingly, a current path connecting the input/output terminal Tio, the transistors P13 and P15, and the source of the power supply voltage $V_{DD}$ is not formed.

Moreover, the P-channel MOS transistor P16 is activated, and the input signal VIH is applied to the N-well of the transistors P12, P13, P14, P15, P16, and P17. This prevents the formation of a PN junction diode between the power supply voltage $V_{DD}$ and the N-well of each transistor P12, P13, P14, P15, P16, and P17.

SUMMARY OF THE INVENTION

In the input/output circuit shown in FIG. 1, the output signal of the NAND circuit 3 is provided to the gate of the output transistor P1 via the transfer gate 2. When the output signal of the NAND circuit 3 rises from an L level to an H level, the transistor N2 of the transfer gate 2 is activated, and the gate potential at the output transistor P1 then increases. Subsequently, the transistor P4 is activated. Then, the gate potential at the output transistor P1 increases to the power supply voltage $V_{DD}$ level.

When the output signal of the NAND circuit 3 falls from an H level to an L level, the transistor P4 is activated. Then, the gate potential at the output transistor P1 decreases. Subsequently, the transistor N2 is activated, and the gate potential at the output transistor P1 decreases to an L level.

In this operation, the response of the increase and decrease of the gate potential at the output transistor P1 with respect to the rise and fall of the output signal of the NAND circuit 3 is slow due to the on-resistance of the transistors P4 and N2. In particular, when the output signal output from the input/output terminal Tio falls from an H level to an L level, the inactivation of the output transistor P1 is delayed. Thus, through current flows from the power supply voltage $V_{DD}$ to the ground GND. This increases power consumption.

The operation of the output transistor P1 cannot follow the data Do when the frequency of the data Do becomes high since the increase and decrease of the gate potential at the output transistor P1 is slow. This obstructs increase of the operation speed.

The transistors N2 and P4 of the transfer gate 2 are alternately activated when the output signal of the NAND circuit 3 rises and falls. Thus, the output signal of the transfer gate 2 provided to the gate of the output transistor P1 has a waveform that includes an inflection point near a median potential of the output signal. The inflection point slows the increase and decrease of the gate potential at the output transistor P1.

In the input/output circuit shown in FIG. 2, the transistors P7 and N6 are activated when high voltage input voltage VIH is input to the input/output terminal Tio during the input mode in which the power supply voltage $V_{DD}$ is supplied. This forms a current path connecting the input/output terminal Tio, transistors P7, N6, pull-down resistor R1, and the ground GND. Accordingly, power consumption increases.

There is no means for providing the input signal VIH to the N-well of the transistors P5, P6, P8, and the N-well is charged via the PN junction diode. The charging of the N-well lowers the operation speed of the transistors P5, P6, and P8.

In the input/output circuit shown in FIG. 3, when the high voltage input signal VIH is input to the input/output terminal Tio during the input mode in which the power supply voltage $V_{DD}$ is supplied, the transistor P14 is activated. Further, the transistor N7 is normally activated. This forms a current path connecting the input/output terminal Tio, the transistors P14, N7, and the ground GND. Accordingly, power consumption increases.

One aspect of the present invention includes an input/output circuit operable in an input mode and an output mode. The input/output circuit includes an input/output terminal, a pull-up output transistor, a pull-down output transistor, and a first logic circuit that operates in accordance with data and an enable signal. The first logic circuit includes an output node connected to the gate of the pull-up output transistor. The first logic circuit activates the pull-up output transistor in the output mode and inactivates the pull-up output transistor in the input mode. A second logic circuit operates in accordance with the data and the enable signal. The second logic circuit operates the pull-down output transistor in a complementary manner with respect to the pull-up output transistor in the output mode. The second logic circuit inactivates the pull-down output transistor in the input mode. A control circuit maintains the pull-up output transistor in the inactivated state regardless of voltage being applied to the input/output terminal in the input mode. A switch circuit disconnects the first logic circuit from a power supply when an input signal having voltage higher than the power supply voltage of the power supply is input to the input/output terminal in the input mode. A back gate control circuit supplies back gates of P-channel MOS transistors in the first logic circuit and the switch circuit with back gate voltage having the same voltage as the input signal when the input signal is input to the input/output terminal in the input mode.

Other aspects and advantages of the present invention will become apparent from the following description, taken in conjunction with the accompanying drawings, illustrating by way of example the principles of the invention.

BRIEF DESCRIPTION OF THE DRAWINGS

The invention, together with objects and advantages thereof, may best be understood by reference to the following description of the presently preferred embodiments together with the accompanying drawings in which.

DETAILED DESCRIPTION OF THE PREFERRED EMBODIMENTS

Figure 4:
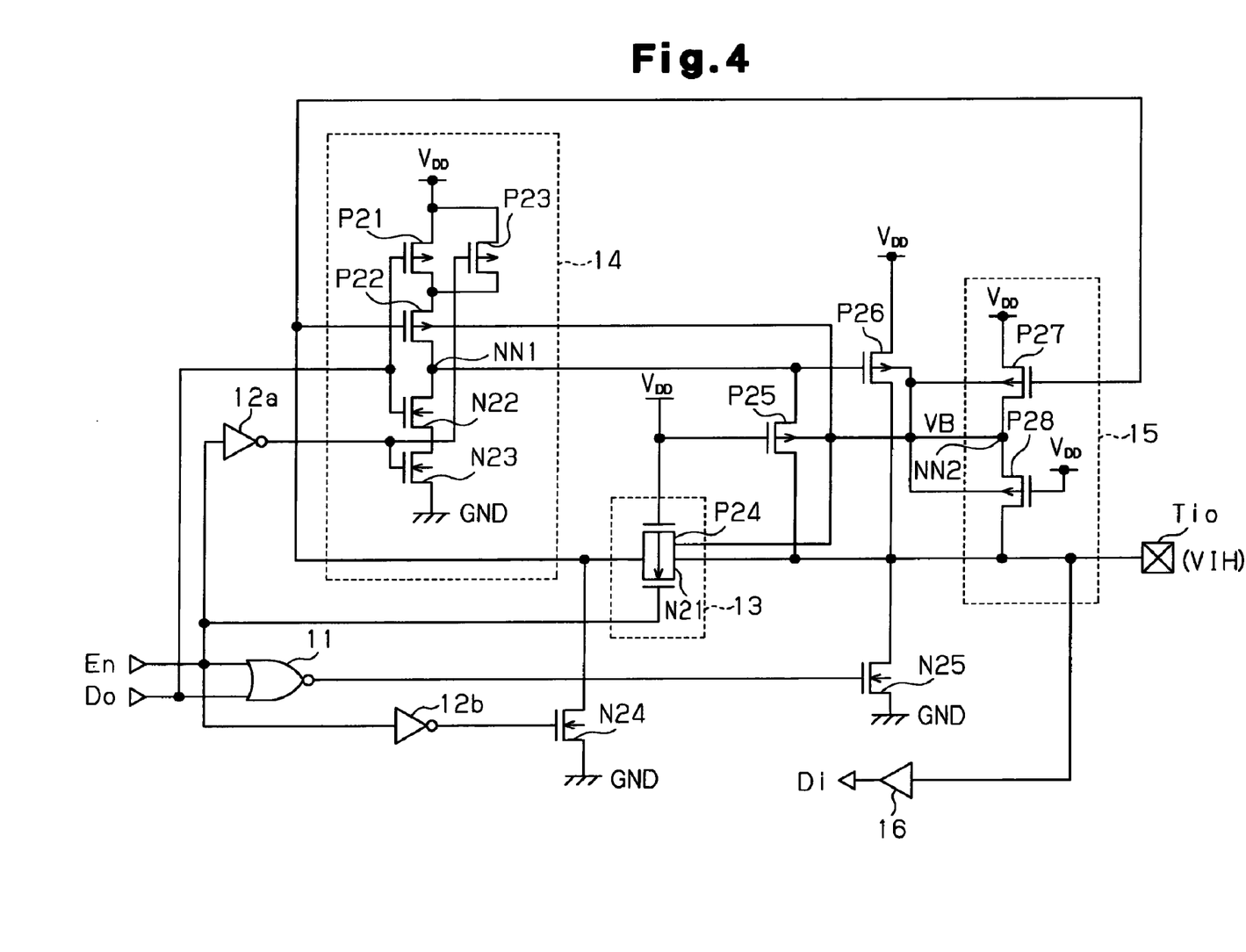
FIG. 4 is a circuit diagram of an input/output circuit according to a first embodiment of the present invention.

FIG. 4 shows an input/output circuit according to a first embodiment of the present invention. The input/output circuit operates in an input mode and an output mode in accordance with an enable signal En and data Do. The enable signal En is provided to each of a NOR circuit (second logic circuit) 11, inverter circuits 12a and 12b, and the gate of an N-channel MOS transistor N21, which is included in a transfer gate 13.

The data Do is provided to the NOR circuit 11 and the gates of a P-channel MOS transistor P21 and an N-channel MOS transistor N22, which are included in a NAND circuit (first logic circuit) 14.

The output signal of the NOR circuit 11 is output from its output terminal and is provided to the gate of an output transistor N25, which is formed by an N-channel MOS transistor. The output signal of the inverter circuit 12b is provided to the gate of an N-channel MOS transistor N24. The source of the transistor N24 is connected to ground GND. The drain of the transistor N24 is connected to the gate of a P-channel MOS transistor P22, which is included in the NAND circuit 14.

The output signal of the inverter circuit 12a is provided to the gates of an N-channel MOS transistor N23 and a P-channel MOS transistor P23, which are included in the NAND circuit 14.

The NAND circuit 14 will now be described. The sources of the transistors P21 and P23 are connected to the power supply voltage $V_{DD}$. The drains of the transistors P21 and P23 are connected to the source of the transistor P22. The drain of the transistor P22 is connected to the drain of the transistor N22. The source of the transistor N22 is connected to the drain of the transistor N23. The source of the transistor N23 is connected to ground GND. The drains of the transistors P22 and N22 are connected to an output node NN1. The output node NN1 functions as an output terminal of the NAND circuit 14.

The NAND circuit 14 is in the output mode when the enable signal En has an L level. The L level enable signal En activates the transistor N23, inactivates the transistor P23, activates the transistor N24, and activates the transistor P22. Accordingly, the NAND circuit 14 is activated, and an inverted signal of the data Do is provided to the output node NN1.

The NAND circuit 14 is in the input mode when the enable signal En has an H level. The H level enable signal En activates the transistor P23, inactivates the transistor N23, and activates the NAND circuit 14.

The output node NN1 is connected to the gate of the output transistor P26, which is formed by the P-channel MOS transistor. The source of the output transistor P26 is connected to the power supply voltage $V_{DD}$. The drain of the output transistor P26 is connected to the drain of the output transistor N25. The source of the output transistor N25 is connected to ground GND. The drains of the output transistors P26 and N25 are connected to the input/output terminal Tio. The transistor P26 is one example of a pull-up output transistor. The transistor N25 is one example of a pull-down output transistor.

The input/output terminal Tio is connected to the transistor P22 of the NAND circuit 14 via the transfer gate 13. The gate of a P-channel MOS transistor P24, which is included in the transfer gate 13, is connected to the power supply voltage $V_{DD}$.

The input/output terminal Tio is connected to the output node NN1 by way of the P-channel MOS transistor P25. The gate of the transistor P25 is connected to the power supply voltage $V_{DD}$.

A back gate control circuit 15 is formed by P-channel MOS transistors P27 and P28. The source of the transistor P27 is connected to the power supply voltage $V_{DD}$. The drain of the transistor P27 is connected to the drain of the transistor P28. The source of the transistor P28 is connected to the input/output terminal Tio.

The gate of the transistor P27 is connected to the gate of the transistor P22. The gate of the transistor P28 is connected to the power supply voltage $V_{DD}$.

Back gate voltage VB is output from a connecting node NN2 of the drains of the transistors P27 and P28. The back gate voltage VB is supplied to the transistors P27 and P28 and the transistors P25, P26, P24, and P22.

The back gate control circuit 15 is in the output mode when the enable signal En has an L level. In the output mode, the transistor N24 is activated, and the transistor P27 is activated. In this case, the transistor P28 is inactivated. Therefore, the back gate voltage VB has the same level as the power supply voltage $V_{DD}$.

In the input mode in which the enable signal En has an H level, the transistor N21 of the transfer gate 13 is activated when the input/output terminal Tio shifts to an L level, or ground GND level. Thus, the transistor P27 is activated, and the back gate voltage VB becomes equal to the power supply voltage $V_{DD}$.

In the input mode, when the input/output terminal Tio shifts to an H level, that is, the level of the power supply voltage $V_{DD}$, the gate voltage of the transistor P27 becomes lower than the level of the power supply voltage $V_{DD}$ by the threshold value of the transistor N21, and the transistor P27 is maintained in the activated state.

Further, in the input mode, when the input signal VIH input to the input/output terminal Tio has a voltage that is higher than the power supply voltage $V_{DD}$ by an amount greater than or equal to the threshold value of a P-channel MOS transistor, the transistor P24 is activated in the transfer gate 13, and the input signal VIH is applied to the transistor P27. This inactivates the transistor P27.

In this case, the transistor P28 is activated and the back gate voltage VB becomes equal to the voltage level of the input signal VIH.

A buffer circuit 16 is connected to the input/output terminal Tio. A signal provided to the input/output terminal Tio in the input mode is further provided to the internal circuit via the buffer circuit 16.

The operation of the input/output circuit will now be discussed.

[Operation in Output Mode]

The enable signal En shifts to an L level when entering the output mode. This inactivates the transfer gate 13 and activates the transistor N24. Further, the NAND circuit 14 is activated, the inverted signal of the data Do is output to the output node NN1, and the inverted signal of the data Do is output from the NOR circuit 11.

As a result, either one of the output transistors P26 and N25 is activated, and an output signal that is in phase with the data Do is output from the input/output terminal Tio. In other words, the output transistor N25 is operated in a complementary manner with respect to the output transistor P26 in the output mode.

In the back gate control circuit 15, the transistor P27 is activated, the transistor P28 is inactivated, and the back gate voltage VB of the power supply voltage $V_{DD}$ level is output.

[Case In Which Signal Lower than or Equal to Power Supply Voltage is Input to Input/Output Terminal Tio in Input Mode]

The enable signal En shifts to an H level when entering the input mode. As a result, the output signal of the NOR circuit 11 shifts to an L level. This inactivates the output transistor N25.

The transistor P23 is activated, the transistor N23 is inactivated, the NAND circuit 14 is inactivated, and the transistor N24 is inactivated. Furthermore, the transistor N21 of the transfer gate 13 is activated.

In this state, when a signal having an L level is input to the input/output terminal Tio, the gate of the transistor P22 is shifted to an L level via the transfer gate 13. Thus, the transistor P22 is activated, the output node NN1 shifts to an H level, and the output transistor P26 is inactivated.

The gate of the transistor P27 is shifted to an L level via the transfer gate 13. Thus, the transistor P27 is activated. Accordingly, the back gate voltage VB having the level of the power supply voltage $V_{DD}$ is output from the back gate control circuit 15.

When a signal having an H level and the same potential as the power supply voltage $V_{DD}$ level is input to the input/output terminal Tio, voltage lower than the power supply voltage $V_{DD}$ by an amount corresponding to the threshold value of the transistor N21 is supplied to the gate of the transistor P22 of the NAND circuit 14 via the transistor N21 of the transfer gate 13.

As a result, the transistor P22 maintained in the activated state, the output node NN1 is maintained at an H level, and the output transistor P26 is maintained in the inactivated state.

In the same manner, the transistor P27 is activated, and the back gate voltage VB of the power supply voltage $V_{DD}$ level is output from the back gate control circuit 15.

[Case In Which Signal Higher Than or Equal to Power Supply Voltage is Input to Input/Output Terminal Tio in Input Mode]

In the input mode, when the input signal VIH having a voltage higher than the power supply voltage $V_{DD}$ level by an amount greater than or equal to the threshold value of the P-channel MOS transistor is input to the input/output terminal Tio, the transistor P25 is activated, and the gate potential at the output transistor P26 becomes equal to the voltage level of the input signal VIH.

As a result, the output transistor P26 is maintained in the inactivated state even if the input signal VIH is applied to the input/output terminal Tio. Thus, a current path connecting the input/output terminal Tio, the output transistor P26, and the source of the power supply voltage $V_{DD}$ is not formed.

The transistor P24 of the transfer gate 13 is activated, and the input signal VIH is applied to the gate of the transistor P22. Thus, the transistor P22 is inactivated. Accordingly, a current path connecting the input/output terminal Tio, the transistors P25 and P22, and the source of the power supply voltage $V_{DD}$ is not formed.

The transistor N24 is inactivated. Thus, a current path connecting the input/output terminal Tio, the transistors P24 and N24, and the ground GND is also not formed.

In the back gate control circuit 15, when the input signal VIH is applied to the input/output terminal Tio, the transistor P27 is inactivated and the transistor P28 is activated. As a result, the back gate voltage VB, which is equal to the voltage of the input signal VIH, is output. As a result, formation of PN junction diode, that is, formation of a current path from the source of the power supply voltage $V_{DD}$ to the N-well is prevented in each of the transistors P27, P28, P25, P26, P24, and P22, which are supplied with the back gate voltage VB.

[Case In Which Signal Higher Than or Equal to Power Supply Voltage is Input to Input/Output Terminal Tio When Supply of Power Supply Voltage $V_{DD}$ is Suspended]

In a state in which the supply of power supply voltage $V_{DD}$ is suspended, if an input signal VIH having voltage higher than the power supply voltage $V_{DD}$ level by an amount greater than or equal to the threshold value of the P-channel MOS transistor is input to the input/output terminal Tio, the transistor P25 is activated, and the gate potential of the output transistor P26 becomes equal to the voltage level of the input signal VIH.

Thus, the output transistor P26 is maintained in the inactivated state even if the input signal VIH is applied to the input/output terminal Tio. Further, a current path connecting the input/output terminal Tio, the output transistor P26, and the source of the power supply voltage $V_{DD}$ is not formed.

Such an operation ensures that the transistor P25, the transfer gate 13, and the transistors P22 and P23 inactivate the output transistor P26 in the input mode. The transistor P25, the transfer gate 13, and the transistors P22 and P23 operate as a control circuit.

The transistor P24 of the transfer gate 13 is activated and the input signal VIH is applied to the gate of the transistor P22. Thus, the transistor P22 is inactivated. Accordingly, the transistor P22 serves as a switch circuit and disconnects the output node NN1 from the power supply voltage $V_{DD}$. Thus, a current path connecting the input terminal Tio, the transistors P25 and P22, and the source of the power supply voltage $V_{DD}$ is not formed.

The transistor N24 is inactivated. Thus, the current path connecting the input/output terminal Tio, the transistors P24 and N24, and the ground GND is not formed.

In the back gate control circuit 15, the transistor P27 is inactivated and the transistor P28 is activated when the input signal VIH is applied to the input/output terminal Tio. This outputs the back gate voltage VB having the voltage level of the input signal VIH. As a result, the formation of a PN junction diode, that is, the formation of the current path from the source of the power supply voltage $V_{DD}$ to the N-well is prevented in each of the transistors P27, P28, P25, P26, 24, and P22, which are supplied with the back gate voltage VB.

The input/output circuit described above has the advantages described below.

(1) In the output mode, the input/output circuit outputs the output signal in phase with the data Do from the input/output terminal Tio.

(2) In the input mode, the input/output circuit provides the input signal provided to the input/output terminal Tio to the internal circuit via the buffer circuit 16.

(3) In the input mode, an unnecessary current path is not formed from the input/output terminal Tio to the source of the power supply voltage $V_{DD}$ or the ground GND even if a signal that is lower than or equal to the power supply voltage $V_{DD}$ or higher than or equal to the power supply voltage $V_{DD}$ level is input to the input/output terminal Tio. This reduces power consumption of the input/output circuit.

(4) The NAND circuit 14 is inactivated in the input mode since the transistors P22, P23, N23 are inactivated. This prevents the formation of a current path connecting the input/output terminal Tio, the NAND circuit 14, and the source of the power supply voltage $V_{DD}$ even if a signal having a level higher than or equal to the power supply voltage $V_{DD}$ is input to the input/output terminal Tio. Thus, the power consumption of the input/output circuit is reduced.

(5) A current path connecting the output node NN1, the NAND circuit 14, and the power supply voltage $V_{DD}$ or the ground GND is prevented from being formed even if the output node NN1 of the NAND circuit 14 is directly connected to the gate of the output transistor P26. This reduces power consumption of the input/output circuit.

(6) Unlike the conventional example shown in FIG. 1, a transfer gate is not arranged between the output node NN1 and the output transistor P26. This enables the operation frequency of the output transistor P26 to increase.

Figure 5:
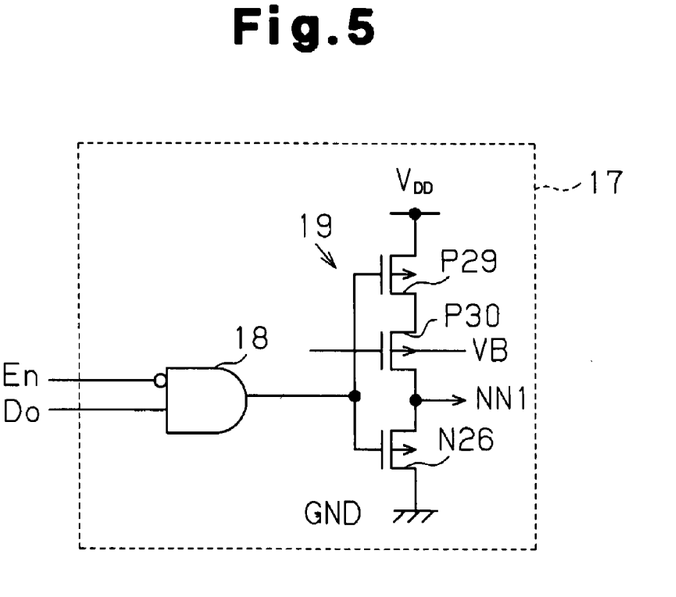
FIG. 5 is a circuit diagram of an NAND circuit arranged in an input/output circuit according to a second embodiment of the present invention.

A second embodiment of the present invention will now be discussed. In the second embodiment, a NAND circuit 17 shown in FIG. 5 is used as the first logic circuit in lieu of the NAND circuit 14 of the first embodiment. The NAND circuit 17 is formed by an AND circuit 18 and an inverter circuit 19. Data Do and an inverted signal of the enable signal En are input to the AND circuit 18.

The inverter circuit 19 includes P-channel MOS transistors P29 and P30 and an N-channel MOS transistor N26. The source of the transistor P29 is connected to the power supply voltage $V_{DD}$. The drain of the transistor P29 is connected to the source of the transistor P30.

The drain of the transistor P30 is connected to the drain of the transistor N26. The source of the transistor N26 is connected to ground GND.

The output signal of the AND circuit 18 is input to the gates of the transistors P29 and N26. The drains of the transistors P30 and N26 are connected to the output node NN1. In the same manner as the transistor P22 of the first embodiment, the gate of the transistor P30 is connected to the drain of the transistor N24 and connected to the input/output terminal Tio via the transfer gate 13. The back gate voltage VB is supplied from the back gate control circuit 15 to the back gate of the transistor P30. The parts other than the NAND circuit 17 are the same as the first embodiment.

In the NAND circuit 17, when the enable signal En shifts to an L level in the output mode, a signal in phase with the data Do is output from the AND circuit 18. Further, the transistor P30 is activated. Thus, the inverted signal of the output signal of the AND circuit 18 is output from the inverter circuit 19 to the output node NN1.

When the enable signal En shifts to an H level in the input mode, the output signal of the AND circuit 18 shifts to an L level. Thus, the transistor N26 is inactivated in the inverter circuit 19.

In this state, even when an input signal VIH that is higher than the power supply voltage $V_{DD}$ is input to the input/output terminal Tio and the input signal VIH is provided to the output node NN1, the input signal VIH is applied to the gate of the transistor P30. Thus, a current path connecting the output node NN1, the transistor P30, and the source of the power supply voltage $V_{DD}$ is not formed. Furthermore, the transistor N26 is inactivated. Thus, a current path connecting the output node NN1, the transistor N26, and the ground GND is also not formed.

The NAND circuit 17 operates in the same manner as the NAND circuit 14 of the first embodiment. Further, only the N-channel MOS transistor N26 is arranged between the output node NN1 and ground GND. Thus, the falling speed of the output node NN1 increases, and the time required to shift the output transistor P26 from an inactivated state to an activated state is shortened. Accordingly, the operation frequency of the input/output circuit may be increased.

Figure 6:
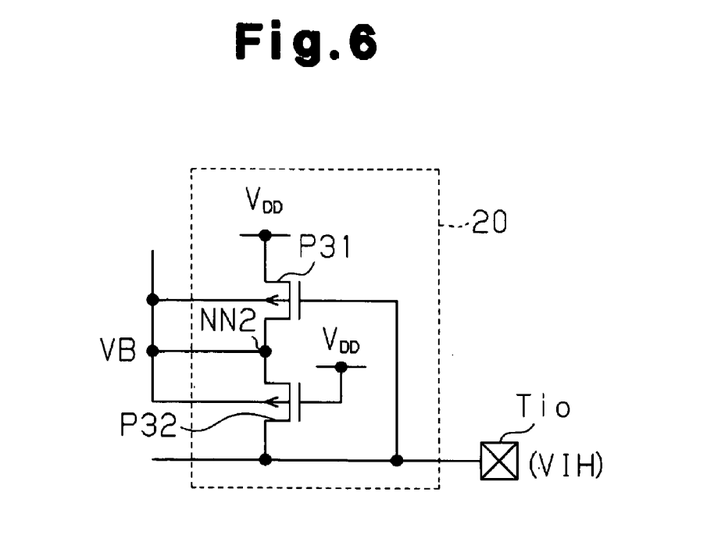
FIG. 6 is a circuit diagram of a back gate control circuit arranged in an input/output circuit according to a third embodiment of the present invention.

A third embodiment of the present invention will now be discussed. In the third embodiment, a back gate control circuit 20 of FIG. 6 is used in lieu of the back gate control circuit 15 of the first embodiment. The back gate control circuit 20 includes P-channel MOS transistors P31 and P32. The back gate control circuit 20 is similar to the back gate control circuit 15 of the first embodiment except in that the gate of the transistor P31 is connected to the input/output terminal Tio.

In such a structure, when the input/output terminal Tio shifts to an L level, the transistor P31 is activated and the transistor P32 is inactivated. Thus, the back gate control circuit 20 outputs back gate voltage VB having the level of the power supply voltage $V_{DD}$.

When input signal VIH having a voltage higher than the power supply voltage $V_{DD}$ by an amount greater than or equal to the threshold value of the P-channel MOS transistor is input to the input/output terminal Tio, the transistor P31 is inactivated, the transistor P32 is activated, and the back gate voltage VB having the voltage level of the input signal VIH is output from the back gate control circuit 20.

Due to the above operation, the back gate control circuit 20 has the same advantages as the back gate control circuit 15 of the first embodiment.

It should be apparent to those skilled in the art that the present invention may be embodied in many other specific forms without departing from the spirit or scope of the invention. Particularly, it should be understood that the present invention may be embodied in the following forms.

The NAND circuit 14 and the NOR circuit 11 may be changed to other logic circuits in accordance with the logic of the enable signal En and the data Do.

In a so-called three state output terminal that provide an L level, H level, and high impedance output states, the buffer circuit 16 may be omitted from each embodiment when connecting the output terminal to a signal wire having a level that is higher than or equal to the level of the power supply voltage $V_{DD}$ in the high impedance state or a state in which the supply of power supply voltage $V_{DD}$ is suspended.

The present examples and embodiments are to be considered as illustrative and not restrictive, and the invention is not to be limited to the details given herein, but may be modified within the scope and equivalence of the appended claims.

What is claimed is:

1. An input/output circuit operable in an input mode and an output mode, the input/output circuit comprising:

an input/output terminal;
a pull-up output transistor;
a pull-down output transistor;
a first logic circuit that operates in accordance with data and an enable signal, the first logic circuit including an output node connected to the gate of the pull-up output transistor and including a P-channel MOS transistor, wherein the first logic circuit activates the pull-up output transistor in the output mode and inactivates the pull-up output transistor in the input mode;
a second logic circuit that operates in accordance with the data and the enable signal, wherein the second logic circuit operates the pull-down output transistor in a complementary manner with respect to the pull-up output transistor in the output mode, and the second logic circuit inactivates the pull-down output transistor in the input mode;
a control circuit for maintaining the pull-up output transistor in the inactivated state regardless of voltage being applied to the input/output terminal in the input mode;
a switch circuit for disconnecting the first logic circuit from a power supply when an input signal having voltage higher than the power supply voltage of the power supply is input to the input/output terminal in the input mode, the switch circuit including a P-channel MOS transistor; and
a back gate control circuit for supplying back gates of the P-channel MOS transistors arranged in the first logic circuit and the switch circuit with back gate voltage having the same voltage as the input signal when the input signal is input to the input/output terminal in the input mode, wherein:
the P-channel MOS transistor of the switch circuit is a power supply disconnection P-channel MOS transistor that is inactivated by the input signal when the input signal is input to the input/output terminal; and
the switch circuit includes a transfer gate for connecting the input/output terminal and the gate of the power supply disconnection P-channel MOS transistor when the input signal is input to the input/output terminal.

2. The input/output circuit according to claim 1, wherein: the first logic circuit is formed by a NAND circuit.

3. The input/output circuit according to claim 1, wherein the first logic circuit includes:
first and second P-channel MOS transistors connected in series between a high potential power supply and the output node of the first logic circuit;
first and second N-channel MOS transistors connected in series between the output node of the first logic circuit and a low potential power supply; and
a third P-channel MOS transistor connected in parallel to the first P-channel MOS transistor;
wherein the second N-channel MOS transistor is inactivated in accordance with the enable signal and the third P-channel MOS transistor is activated in the input mode;
the second N-channel MOS transistor is activated in accordance with the enable signal and the third P-channel MOS transistor is inactivated in the output mode;
the data is provided to the gate of each of the first P-channel MOS transistor and the first N-channel MOS transistor; and
the second P-channel MOS transistor is activated in accordance with the enable signal in the output mode, and the second P-channel MOS transistor receives the input signal via the transfer gate in the input mode, wherein the second P-channel MOS transistors is the power supply disconnection P-channel MOS transistor.

4. The input/output circuit according to claim 1, wherein the first logic circuit includes:
first and second P-channel MOS transistors connected in series between a high potential power supply and the output mode;
a third N-channel MOS transistor connected between the output node of the first logic circuit and a low potential power supply; and
an AND circuit for providing a logical sum signal of the enable signal and the data to the gate of each of the first P-channel MOS transistor and the third N-channel MOS transistor;
wherein the third N-channel MOS transistor is inactivated in accordance with the enable signal and the first P-channel MOS transistor is activated in the input mode, and the data is input to the gate of each of the first P-channel MOS transistor and the third N-channel MOS transistor in the output mode; and
the second P-channel MOS transistor is activated in accordance with the enable signal in the output mode, and the second P-channel MOS transistor receives the input signal via the transfer gate in the input mode.

5. The input/output circuit according to claim 1, wherein:
the back gate control circuit includes fourth and fifth P-channel transistors connected in series between a high potential power supply and the input/output terminal, with the fourth P-channel MOS transistor being connected to the high potential power supply, and the fifth P-channel MOS transistor being connected to the input/output terminal;
the fourth P-channel MOS transistor has a gate connected to the input/output terminal; and
the fifth P-channel MOS transistor has a gate connected to the high potential power supply, and the back gate voltage being output from a connecting node of the fourth and fifth P-channel MOS transistors.

6. The input/output circuit according to claim 1, wherein:
the first logic circuit is an NAND circuit;
the output node of the first logic circuit is an output terminal of the NAND circuit;
the output terminal of the NAND circuit is directly connected to the gate of the pull-up output transistor;
the second logic circuit is a NOR circuit having an output terminal directly connected to a gate of the pull-down output transistor.

7. The input/output circuit according to claim 1, wherein the transfer gate connects the input/output terminal and the power supply disconnection P-channel MOS transistor in response to the enable signal in the input mode.

* * * * *